United States Patent
Evani et al.

(10) Patent No.: US 11,909,387 B2
(45) Date of Patent: Feb. 20, 2024

(54) MICROPHONE WITH SLEW RATE CONTROLLED BUFFER

(71) Applicant: Knowles Electronics, LLC, Itasca, IL (US)

(72) Inventors: Satya Sai Evani, Itasca, IL (US); Sudheer Gutta, Itasca, IL (US); Sreenath Pariyarath, Itasca, IL (US); Gururaj Ghorpade, Itasca, IL (US); Sruthi Panangavil, Itasca, IL (US)

(73) Assignee: KNOWLES ELECTRONICS, LLC., Itasca, IL (US)

( * ) Notice: Subject to any disclaimer, the term of this patent is extended or adjusted under 35 U.S.C. 154(b) by 147 days.

(21) Appl. No.: 17/691,717

(22) Filed: Mar. 10, 2022

(65) Prior Publication Data

US 2022/0337243 A1    Oct. 20, 2022

(30) Foreign Application Priority Data

Mar. 17, 2021  (IN) .............................. 202111011368

(51) Int. Cl.
   *H03K 17/687*    (2006.01)
   *H04R 3/00*    (2006.01)
(52) U.S. Cl.
   CPC ........... *H03K 17/6872* (2013.01); *H04R 3/00* (2013.01); *H04R 2203/00* (2013.01)
(58) Field of Classification Search
   CPC ... H03K 17/6872; H04R 3/00; H04R 2203/00
   See application file for complete search history.

(56) References Cited

U.S. PATENT DOCUMENTS

| | | | |
|---|---|---|---|
| 7,190,038 B2 | 3/2007 | Dehe et al. | |
| 7,473,572 B2 | 1/2009 | Dehe et al. | |
| 7,781,249 B2 | 8/2010 | Laming et al. | |
| 7,795,695 B2 | 9/2010 | Weigold et al. | |
| 7,825,484 B2 | 11/2010 | Martin et al. | |
| 7,829,961 B2 | 11/2010 | Hsiao | |
| 7,856,804 B2 | 12/2010 | Laming et al. | |
| 7,903,831 B2 | 3/2011 | Song | |
| 9,386,370 B2 | 7/2016 | Nielsen et al. | |
| 9,590,571 B2* | 3/2017 | Jennings | H03F 3/185 |
| 9,668,051 B2 | 5/2017 | Nielsen et al. | |
| 2005/0207605 A1 | 9/2005 | Dehe et al. | |
| 2007/0205814 A1* | 9/2007 | Chatal | H03K 19/00361 327/112 |
| 2007/0278501 A1 | 12/2007 | MacPherson et al. | |
| 2008/0175425 A1 | 7/2008 | Roberts et al. | |
| 2008/0267431 A1 | 10/2008 | Leidl et al. | |
| 2008/0279407 A1 | 11/2008 | Pahl | |
| 2008/0283942 A1 | 11/2008 | Huang et al. | |
| 2009/0001553 A1 | 1/2009 | Pahl et al. | |
| 2009/0180655 A1 | 7/2009 | Tien et al. | |

(Continued)

*Primary Examiner* — David L Ton
(74) *Attorney, Agent, or Firm* — FOLEY & LARDNER LLP

(57) ABSTRACT

A digital microphone or other sensor assembly includes a transducer and an electrical circuit including a slew-rate controlled output buffer configured to reduce propagation delay and maintain output rise and fall time independent of PVT variation and load capacitance. In some embodiments, the portions of the output buffer are selectably disabled to reduce power consumption without adversely substantially increasing propagation delay.

20 Claims, 4 Drawing Sheets

(56) References Cited

U.S. PATENT DOCUMENTS

| | | |
|---|---|---|
| 2010/0046780 A1 | 2/2010 | Song |
| 2010/0052082 A1 | 3/2010 | Lee et al. |
| 2010/0128914 A1 | 5/2010 | Khenkin |
| 2010/0183181 A1 | 7/2010 | Wang |
| 2010/0246877 A1 | 9/2010 | Wang et al. |
| 2010/0290644 A1 | 11/2010 | Wu et al. |
| 2010/0322443 A1 | 12/2010 | Wu et al. |
| 2010/0322451 A1 | 12/2010 | Wu et al. |
| 2011/0013787 A1 | 1/2011 | Chang |
| 2011/0075875 A1 | 3/2011 | Wu et al. |
| 2014/0197887 A1 | 7/2014 | Hovesten et al. |

\* cited by examiner

400

| En | Data | S1 | S2 | S3 | S4 | Pad State |
|---|---|---|---|---|---|---|
| 0 | X | OFF | ON | OFF | ON | HiZ |
| 1 | 1 | ON | OFF | OFF | ON | High |
| 1 | 0 | OFF | ON | ON | OFF | Low |

FIG. 4

502 — Generate An Electrical Signal Representative Of A Condition Sensed By A Transducer Of The Digital Sensor Assembly 504 — Provide An Output Signal, Based On The Electrical Signal, At An Output Node Of A Slew-Rate Controlled Output Driver 506 — Selectably Couple A Feedback Capacitor Between A Low Impedance Source Of A Current Sink And The Output Node When The Current Sink Is Enabled 508 — Discharge The Output Driver Gate Via A Drain Of The Current Sink When The Feedback Capacitor Is Coupled Between The Source Of The Current Sink And The Output Node 510 — Selectably Couple The Feedback Capacitor To A Second Current Sink Circuit When The First Current Sink Circuit Is Disabled, Wherein The Second Current Sink Circuit Maintains Charge On The Feedback Capacitor When The First Current Sink Circuit Is Disabled

FIG. 5

MICROPHONE WITH SLEW RATE CONTROLLED BUFFER

CROSS-REFERENCE TO RELATED PATENT APPLICATION

This application claims and benefit of, and priority to, Indian Provisional Patent Application No. 202111011368 filed Mar. 17, 2021, the entirety of which is incorporated by reference herein.

TECHNICAL FIELD

The present disclosure relates generally to microphone and other sensor assemblies and in particular to digital sensor assemblies having a slew rate controlled output buffer, electrical circuits therefor and methods of operation.

BACKGROUND

Digital microphone assemblies having an electro-acoustic transduction element and an electrical circuit disposed in a housing having an interface for integration with a host device are known generally. Such microphones are employed in mobile communication devices, laptop computers, smart speakers, and appliances, among other devices and machinery. Digital microphones typically include an output buffer that communicates with other circuits via traces on a circuit board of the host. It is generally desirable to reduce propagation delay in the output buffer and to control output rise and fall time for a variety of load conditions, as it enables the system operate at higher clock rates and at the same time avoid EMI issues.

BRIEF DESCRIPTION OF THE DRAWINGS

The objects, features and advantages of the present disclosure will become more fully apparent from the following description and appended claims considered in conjunction with the accompanying drawings. These drawings depict only representative embodiments and are therefore not to be considered to limit the scope of the disclosure.

FIG. 4 is a representative switching logic truth table for the slew-rate controlled buffer circuit of FIG. 3.

FIG. 5 is an operational flow chart for a sensor assembly having a slew-rate controlled output buffer.

Those of ordinary skill in the art will appreciate that the figures are illustrated for simplicity and clarity and therefore may not be drawn to scale and may not include well-known features, that the order of occurrence of actions or steps may be different than the order described or be performed concurrently unless specified otherwise, and that the terms and expressions used herein have the meaning understood by those of ordinary skill in the art except where different meanings are attributed to them herein.

DETAILED DESCRIPTION

The present disclosure relates generally to digital microphones and other sensor assemblies including a transducer and an electrical circuit having a slew-rate controlled output buffer with improved propagation delay suitable for use with a variety of load conditions, electrical circuits therefor and methods of operation.

Figure 1:
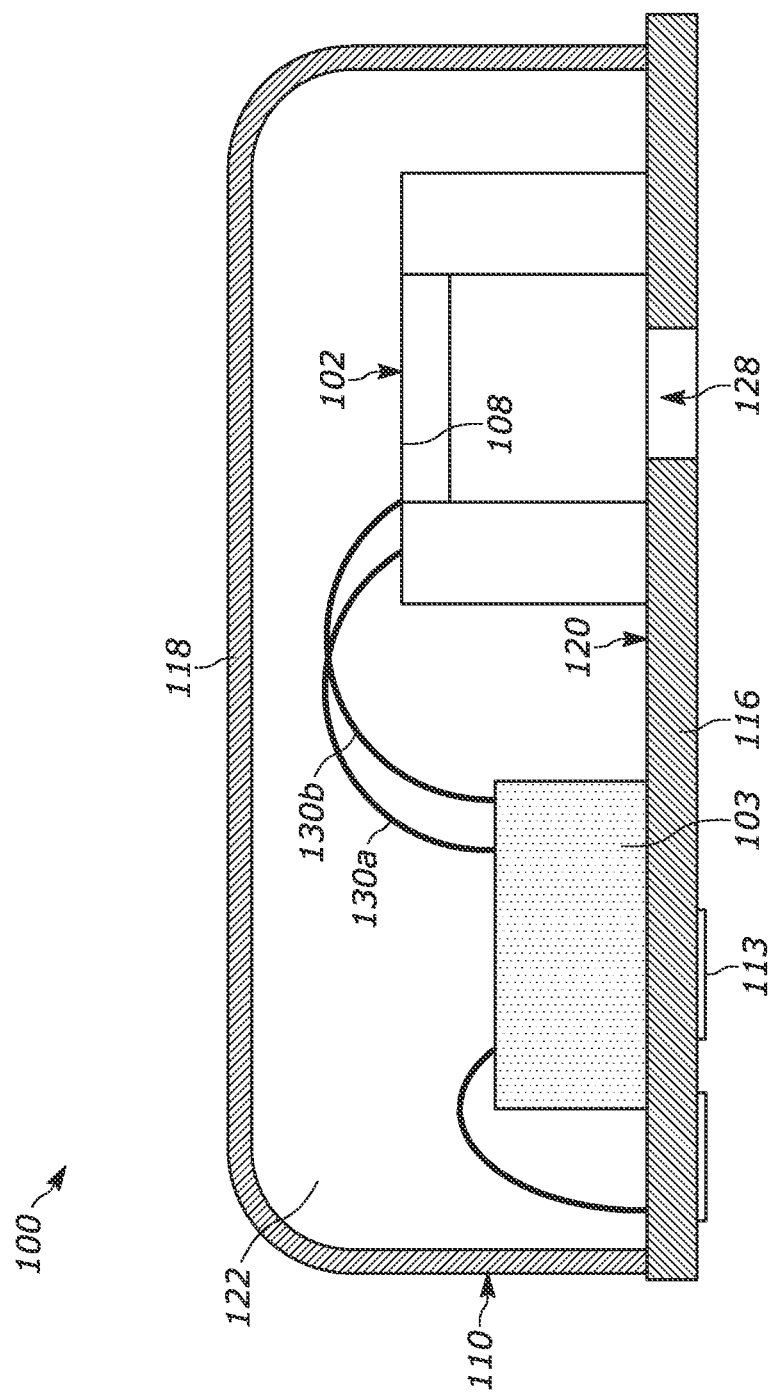
FIG. 1 is a cross-sectional view of a representative digital sensor.

FIG. 1 is a cross-sectional view of a representative sensor assembly 100 including a transducer 102 coupled to an electrical circuit 103 disposed within a housing 110. The housing includes a base 116 and a cover 118 fastened to an upper surface 120 of the base. The housing 110 also includes an electrical interface with contacts (e.g., supply, ground, data, clock, select, etc.) configured to interface with a host device. The electrical circuit 103 is coupled to the transducer 102 via leads 130a and 130b and to contacts on the host interface 113. The electrical circuit can obtain power, clock and other signals from contacts on the host-interface. In FIG. 1, the host-interface is a surface-mount interface 113 located on an outer surface of the base 116 and is suitable for a reflow soldering processes. In other embodiments, the host-interface can have some other form factor, like through-hole pins, or be located on some other part of the housing.

In some implementations, the housing shields the transducer and the electrical circuit located within the interior 122 of the housing from electromagnetic interference like RF noise. For this purpose, the cover can be metal or include a conductive portion electrically coupled to a conductive portion of the base.

In some sensor assemblies, like microphones, the housing 110 includes an aperture (also called a "port") connecting an interior of the housing 110 to the external environment. In FIG. 1, the port 128 is located on the base 116 in alignment with the transducer 102. In other sensor assemblies, the port can be on some other part of the housing, like the cover or sidewall. Other sensor assemblies, like acoustic vibration sensors and accelerometers among others, do not require a port.

In one implementation, the sensor assembly is a microphone assembly and the transducer is configured to generate an electrical signal representative of acoustic signals propagated through the atmosphere and detected by the transducer. In other implementations, the sensor assembly is configured to detect and generate electrical signals representative of acoustic vibrations propagated through a person's body or an inanimate object. Other sensor assemblies can be configured to detect pressure, acceleration, humidity, gas and temperature among other conditions. The transducer may be a capacitive, piezoelectric, optical or other transduction device implemented as a microelectromechanical systems (MEMS) device or as some other known or future device. The transducer generates an electrical signal representative of a condition (e.g., voice, vibration, humidity, gas . . . ) sensed by the transducer, as depicted at 502 in the operational flow chart of FIG. 5, for further processing or conditioning by the electrical circuit.

In digital sensor assemblies, the electrical circuit comprises an analog-to-digital (ADC) circuit configured to receive an analog signal generated by the transducer and output a digital signal representative of the analog signal, and an output buffer to provide the processed output signal at the host interface of the sensor assembly. The output signal, based on the electrical signal, is provided at an output node of the slew-rate controlled output buffer, depicted at 504 in the operational flow chart of FIG. 5. More generally the buffer can be an input/output buffer. The electrical circuit optionally includes a signal conditioning circuit between the transducer and the ADC. Generally, the signal conditioning circuit can include a low noise amplifier, a buffer, a filter or some combination of these and other signal conditioning circuits. The processing circuit can also optionally include a digital circuit between the digital output of the ADC and the output buffer for further processing the digital signal output by the ADC. In one implementation, the digital circuit is configured to format the digital signal for a particular digital protocol like PDM or Soundwire, among others. Alternatively, the electrical circuit can output a PCM format signal at the output terminal. The electrical circuit can also include other circuit elements, depending on the transducer type and the particular sensor configuration, some of which are described herein. The electrical circuit can be implemented as one or more integrated circuits (ICs). Such ICs can include, for example, an application specific integrated circuit (ASIC) with analog and/or digital circuits, a digital signal processor (DSP), among other ICs, alone or in combination.

Figure 2:
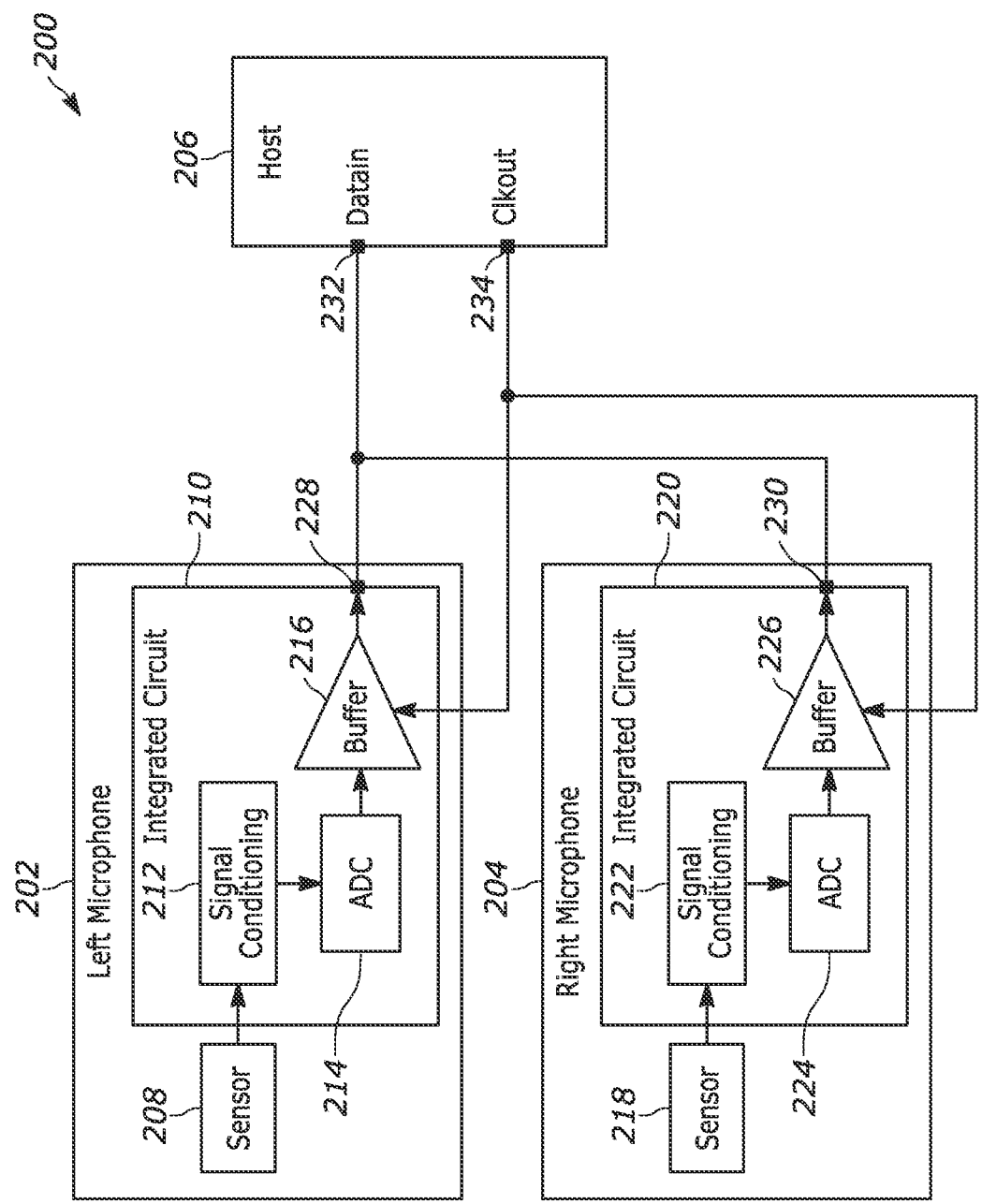
FIG. 2 illustrates of left and right microphones including slew-rate controlled buffer circuits coupled to a host device.

In the representative system 200 of FIG. 2, first and second microphones 202, 204 are integrated with a host device 206 and communicate over a common bus. In other systems, a single microphone can be integrated with the host. More generally, one or more other sensors assemblies or a combination of different sensor assemblies can be integrated with the host. The microphones comprise a sensor 208, 218 and an electrical circuit 210, 220 comprising a signal conditioning circuit 212, 222 and an ADC 214, 224 as described herein. The electrical circuit also comprises a buffer 216, 226 coupled to a terminal 228, 230 coupled to an interface 232 of the host device via a shared data bus. The bus can be unidirectional or bidirectional. Alternatively the bus need not be shared. In FIG. 2, the host device provides a clock signal to the microphones via a terminal 234 of the host to the one or more sensor assemblies to synchronize the one or more sensor assemblies with the host.

Figure 3:
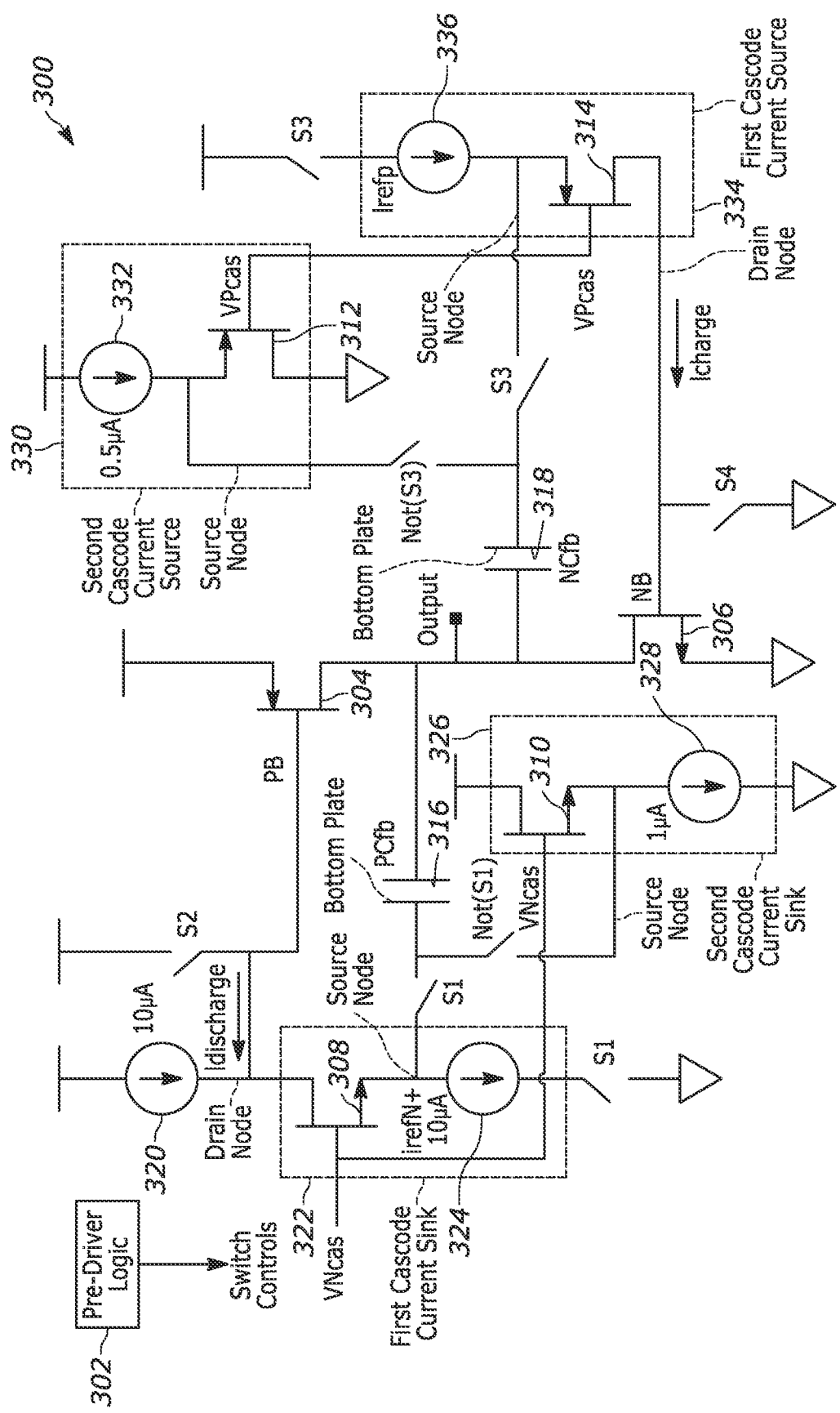
FIG. 3 is a schematic of a representative slew-rate controlled buffer circuit.

FIG. 3 is a slew-rate controlled buffer circuit 300 that can be implemented in digital sensor assemblies of the type described herein, wherein the circuit components and values are examples for a representative implementation. The slew-rate controlled buffer circuit 300 generally comprises an output driver formed by a first driver transistor and a second drive transistor, implemented as a push-pull CMOS driver circuit comprising a PMOS driver 304 and a NMOS driver 306 with an "Output" node therebetween. A first cascode current sink 322 comprises a current sink 324 and an NMOS transistor 308 having a drain node coupled to the gate of the PMOS driver 304. The current source 320 enables bi-directional slew-rate control during signal transition from low to high at the Output node. A first cascode current source 334 comprises a current source 336 and a PMOS transistor 314 having a drain node coupled to the gate of the NMOS driver 306. In implementations susceptible to a supply voltage dip, the gate of the output driver can be coupled to a compensation circuit to provide bidirectional slew-rate control. In FIG. 3, for example, the gate of PMOS driver 304 is coupled to a current source 320 for this purpose.

In FIG. 3, driver logic 302 controls operation of the slew-rate controlled buffer circuit 300 through actuation of switches S1, S2, S3 and S4 and inverse switches NOT(S1) and NOT(S3) having opposite states as switches S1 and S3, respectively. FIG. 4 illustrates a representative switching logic truth table implemented by the driver logic 302 of the representative slew-rate controlled output buffer of FIG. 3. In FIG. 4, the "En" column indicates whether the driver logic is enabled ("1") or disabled ("0"). The "Data" column indicates the state of the data input to the output buffer. The S1-S4 columns indicate the status of the switches, S1, S2, S3 and S4 and their complements Not(S1) and Not(S3). The "Pad State" column indicates the state of the signal at the Output pad of the slew-rate controlled output buffer, High ("1"), Low ("0") or high impedance (HiZ).

According to one aspect of the disclosure, the rise time and fall time of the slew-rate controlled buffer circuit are made independent of process, voltage, temperature (PVT) variation and/or load capacitance using capacitive feedback between an output node of the buffer circuit and a low impedance node. Generally the feedback capacitor is selectably coupled between the low impedance source of a current sink and the output node when the current sink is enabled, depicted at block 506 of FIG. 5. More specifically, in FIG. 3, a first feedback capacitor 316 is selectably coupled to a source of the first cascode current sink 322 when switches S1 are closed, wherein the source has a low impedance and stable voltage when S1 is closed. Similarly, a second feedback capacitor 318 is selectably coupled to a source of the first cascode current source 324 when S3 is closed, wherein the source has a low impedance and stable voltage when S3 is closed.

In operation, generally, the output driver gate is discharged via a drain of the current sink when the feedback capacitor is coupled between the source of the current sink and the output node, depicted at 508 of the operational flow chart of FIG. 5. In FIG. 3, more particularly, when S1 is closed and S2 is opened, the PMOS driver 304 is enabled and the entire current ($I_{REFN}$) of the current sink 324 is available to quickly discharge the gate of the PMOS driver 304 when the PMOS driver needs to be enabled, thereby reducing propagation time. A current source 320 connected to the drain of the first cascode current sink 322 ensures that the rise time control loop is bi-directional. The current source 320 compensates for any under voltage on the gate of the PMOS driver 304 thereby providing constant rise time even if there is a dip on the supply voltage. The current sink 324 can be increased (e.g., by 10 uA) to provide the desired slew rate (e.g., to make dV/dt equal to $I_{REFN}/PC_{FB}$). Similarly, when S3 is closed and S4 is open, the entire current ($I_{REFP}$) of the current source 334 is available to quickly charge the gate of the NMOS driver 306 when the NMOS driver needs to be enabled. Thus configured, the slew-rate controlled output buffer can provide consistent rise time and fall time on the Output node irrespective of PVT variation and capacitive load.

The quiescent current and thus power consumption of the slew-rate controlled output buffer 300 of FIG. 3 will be high if the current sink 322 and current source 334 remain ON during the entire duration that the buffer is ON. For mobile and other battery-powered applications, it may be desirable to reduce power consumption of the slew-rate controlled output buffer. Power consumption can be reduced by turning OFF the current sink 322 when the gate of PMOS driver 304 is pulled high and turning OFF the current source 334 when the gate of NMOS driver 306 is pulled low. However, the the voltage on the bottom plate (opposite the Output) of feedback cap 316 will not be held constant if the current sink 322 is toggled ON and OFF, resulting in propagation delay. Similarly, the voltage on the bottom plate (opposite the Output) of feedback cap 318 will not be held constant if the current source 334 is toggled ON and OFF.

According to another aspect of the disclosure, voltage on the feedback capacitors is maintained when the current sink and the current source are turned OFF to reduce power consumption. Maintaining the bottom plate voltage on the feedback capacitors when the current sink and current source are OFF helps reduce propagation delay. These acts are depicted at 510 in the operational flow chart of FIG. 5. In FIG. 3, a second cascode current sink 326 selectably coupled to the first feedback capacitor 316 by a switch NOT(S1) that is an inverse of S1 maintains voltage on the first feedback capacitor 316 when the first current sink is OFF. The second current sink includes a NMOS transistor 310 having its source coupled to a second current sink 328 and to the first feedback capacitor 316 by the switch NOT (S1) for this purpose. Similarly, a second cascode current source 330 selectably coupled to the second feedback capacitor 318 by a switch NOT(S3) that is an inverse of S3 maintains voltage on the second feedback capacitor 318 when the first current source is OFF. The second current source includes a PMOS transistor 312 having its source coupled to a second current source 332 and to the second feedback capacitor 318 by the switch NOT(S3) for this purpose. The power consumption reduction circuit need not be implemented where power consumption is not a concern (e.g., in applications wherein the sensor assembly or host device is connected to a power main).

In FIG. 4, when the input Data is "1", the driver logic 302 produces a High signal on the Output of the slew-rate controlled output buffer by turning ON (i.e., closing) S1 and S4 and turning OFF (i.e., opening) S2 and S3. In this configuration, the first current sink 322 is ON, the second current sink 326 is not coupled to the first feedback capacitor 316, the first current source 334 is OFF, and the second current source 330 is coupled to the second feedback capacitor since NOT(S3) is ON (i.e., closed). When the input Data is "0", the driver logic 302 produces a Low signal on the Output of the slew-rate controlled output buffer by turning OFF (i.e., opening) S1 and S4 and turning ON (i.e., closing) S2 and S3. In this configuration, the first current sink 322 is OFF, the second current sink 326 is coupled to the first feedback capacitor 316, the first current source 334 is ON, and the second current source 330 is not coupled to the second feedback capacitor 318 since NOT(S3) is OFF (i.e., open).

The representative slew-rate controlled buffer 300 in FIG. 3 is capable of achieving a ±15% accuracy in rise time and fall time for a load capacitance in the range of about 20 pF to about 160 pF. Propagation delay achieved is approximately 25 ns, about one-half the approximately 60 ns propagation delay of a conventional capacitive feedback based slew-rate controlled buffer. Quiescent current used for the slew-rate controlled buffer 300 was a maximum of 10 uA. This is a very small fraction of (almost 30 times lower than) the average switching current of the slew-rate controlled buffer at max load capacitance (e.g., 160 pF) and operating at the highest frequency of approximately 1.5 MHz. Hence, the quiescent current draw of the slew-rate controlled buffer is negligible compared to the average switching current.

The slew-rate controlled output buffer circuit having reduced propagation delay along with output rise and fall time that is independent of PVT variation and load capacitance alone or in combination with the power saving feature can thus be implemented in a variety of sensor assemblies not limited to microphones, examples of which are described herein.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A digital sensor assembly comprising:
 a transducer configured to generate an analog signal responsive to a sensed environmental condition;
 an analog-to-digital converter (ADC) having an input coupled to the transducer; and
 a slew-rate controlled output buffer having an input coupled to an output of the ADC, the slew-rate controlled output buffer comprising:
  a first current sink circuit;
  an output driver comprising a first driver coupled to the first current sink circuit; and
  a first feedback capacitor selectably coupled between a low impedance node of the first current sink circuit and an output node of the output driver when the first current sink circuit is enabled,
 wherein the first current sink circuit discharges the first driver gate when the first driver needs to be turned ON.

2. The digital sensor of claim 1, the first current sink circuit is a first cascode current sink circuit comprising a drain node coupled to a first gate of the first driver and to a current source circuit, the first cascode current sink circuit comprising a source node selectably coupled to the first feedback capacitor when the first current sink circuit is enabled.

3. The digital sensor of claim 1, the slew-rate controlled output buffer further comprising a second current sink circuit selectably coupled to the first feedback capacitor when the first current sink circuit is disabled, wherein the second current sink circuit maintains charge on the first feedback capacitor when the first current sink circuit is disabled.

4. The digital sensor of claim 1, the slew-rate controlled output buffer further comprising:
 a first current source circuit;
 the output driver further comprising a second driver coupled to the first driver and the first current source circuit, the first driver and the second driver are complementary devices; and
 a second feedback capacitor coupled to the output node of the output driver and selectably coupled to a low impedance node of the first current source circuit when the first current source circuit is enabled,
 wherein the first current source circuit charges the second driver gate when the second driver needs to be turned ON.

5. The digital sensor of claim 4, the slew-rate controlled output buffer further comprising:
 a second current sink circuit selectably coupled to the first feedback capacitor when the first current sink circuit is disabled, wherein the second current sink circuit maintains charge on the first feedback capacitor when the first current sink circuit is disabled; and
 a second current source circuit selectably coupled to the second feedback capacitor when the first current source circuit is disabled, wherein the second current source circuit maintains charge on the second feedback capacitor when the first current source circuit is disabled.

6. The digital sensor of claim 5,
 the first current sink circuit is a first cascode current sink circuit comprising a drain node coupled to a first gate of the first driver and to a current source, the first cascode current sink circuit comprising a source node selectably coupled to the first feedback capacitor, wherein the current source enables bi-directional slew-rate control during signal transition between low and high at the output node, the second current sink circuit is a second cascode current sink circuit having a source node selectably coupled to the first feedback capacitor opposite the output node, wherein the second current sink circuit maintains charge on the first feedback capacitor when data on the output node is low or impedance is high, the first current source circuit is a first cascode current source circuit comprising a drain node coupled to a second gate of the second driver, the first cascode current source circuit comprising a source node selectably coupled to the second feedback capacitor, and the second current source circuit is a second cascode current source circuit having a source node selectably coupled to the second feedback capacitor opposite the output node, wherein the second cascode current source circuit maintains charge on the second feedback capacitor when data on the output node is high or impedance is high.

7. The digital sensor of claim 6, wherein a gate of the first cascode current sink circuit is coupled to a gate of the second cascode current sink circuit, and a gate of the first cascode current source circuit is coupled to a gate of the second cascode current source circuit.

8. The digital sensor of claim 5, the slew-rate controlled output buffer further comprising a pre-driver coupled to the output driver and configured to:
  enable the first current sink circuit and connect it to the first feedback capacitor when the first transistor needs to be enabled;
  disable the first current sink circuit and connect the second current sink circuit to the first feedback capacitor, and pullup a gate of the first driver when the first transistor needs to be disabled;
  enable the first current source circuit and connect it to the second feedback capacitor when the second transistor needs to be enabled; and
  disable the first current source circuit connect second current source circuit to the second feedback capacitor and pulldown a gate of the second driver when the second transistor needs to be disabled.

9. The digital sensor of claim 4, the output driver is a push-pull CMOS driver wherein the first transistor is a PMOS transistor and the second transistor is an NMOS transistor.

10. An electrical circuit for a digital sensor assembly, comprising:
  a slew-rate controlled output buffer having an input connectable to a digital circuit of a digital sensor assembly, the slew-rate controlled output buffer comprising:
    a first current sink circuit;
    an output driver comprising a first driver coupled to the first current sink circuit; and
    a first feedback capacitor selectably coupled between a low impedance node of the first current sink circuit and an output node of the output driver when the first current sink circuit is enabled,
  wherein the first current sink circuit discharges the first driver gate when the first driver needs to be enabled.

11. The electrical circuit of claim 10, the first current sink circuit is a first cascode current sink circuit comprising a drain node coupled to a first gate of the first driver and to a current source circuit, the first cascode current sink circuit comprising a source node selectably coupled to the first feedback capacitor when the first current sink circuit is enabled.

12. The electrical circuit of claim 10, the slew-rate controlled output buffer further comprising a second current sink circuit selectably coupled to the first feedback capacitor when the first current sink circuit is disabled, wherein the second current sink circuit maintains charge on the first feedback capacitor when the first current sink circuit is disabled.

13. The electrical circuit of claim 10, the slew-rate controlled output buffer further comprising:
  a first current source circuit;
  the output driver further comprising a second driver coupled to the first driver and the first current source circuit, the first driver and the second driver are complementary devices; and
  a second feedback capacitor coupled to the output node of the output driver and selectably coupled to a low impedance node of the first current source circuit when the first current source circuit is enabled,
  wherein the first current source circuit charges the second driver gate when the second driver needs to be enabled.

14. The electrical circuit of claim 13, the slew-rate controlled output buffer further comprising:
  a second current sink circuit selectably coupled to the first feedback capacitor when the first current sink circuit is disabled, wherein the second current sink circuit maintains charge on the first feedback capacitor when the first current sink circuit is disabled; and
  a second current source circuit selectably coupled to the second feedback capacitor when the first current source circuit is disabled, wherein the second current source circuit maintains charge on the second feedback capacitor when the first current source circuit is disabled.

15. The electrical circuit of claim 14,
  the first current sink circuit is a first cascode current sink circuit comprising a drain node coupled to a first gate of the first driver and to a current source, the first cascode current sink circuit comprising a source node selectably coupled to the first feedback capacitor, wherein the current source enables bi-directional slew-rate control during signal transition between low and high at the output node,
  the second current sink circuit is a second cascode current sink circuit having a source node selectably coupled to the first feedback capacitor opposite the output node, wherein the second current sink circuit maintains charge on the first feedback capacitor when data on the output node is low or impedance is high,
  the first current source circuit is a first cascode current source circuit comprising a drain node coupled to a second gate of the second driver, the first cascode current source circuit comprising a source node selectably coupled to the second feedback capacitor, and
  the second current source circuit is a second cascode current source circuit having a source node selectably coupled to the second feedback capacitor opposite the output node, wherein the second cascode current source circuit maintains charge on the second feedback capacitor when data on the output node is high or impedance is high.

16. The electrical circuit of claim 15, wherein a gate of the first cascode current sink circuit is coupled to a gate of the second cascode current sink circuit, and a gate of the first cascode current source circuit is coupled to a gate of the second cascode current source circuit.

17. The electrical circuit of claim 14, the slew-rate controlled output buffer further comprising a pre-driver coupled to the output driver and configured to:

enable the first current sink circuit and connect it to the first feedback capacitor when the first transistor needs to be enabled;

disable the first current sink circuit and connect the second current sink circuit to the first feedback capacitor, and pullup a gate of the first driver when the first transistor needs to be disabled;

enable the first current source circuit and connect it to the second feedback capacitor when the second transistor needs to be enabled; and disable the first current source circuit connect second current source circuit to the second feedback capacitor and pulldown a gate of the second driver when the second transistor needs to be disabled.

18. The digital sensor of claim 13, the output driver is a push-pull CMOS driver wherein the first transistor is a PMOS transistor and the second transistor is an NMOS transistor.

19. A method of operating a digital sensor assembly having a slew-rate controlled output driver, the method comprising:

generating an electrical signal representative of a condition sensed by a transducer of the digital sensor assembly;

providing an output signal, based on the electrical signal, at an output node of slew-rate controlled output driver;

selectably coupling a feedback capacitor between a low impedance source of a current sink and the output node when the current sink is enabled, discharging the output driver gate via a drain of the current sink when the feedback capacitor is coupled between the source of the current sink and the output node.

20. The method of claim 19, further comprising selectably coupling the feedback capacitor to a second current sink circuit when the first current sink circuit is disabled, wherein the second current sink circuit maintains charge on the feedback capacitor when the first current sink circuit is disabled.

* * * * *